July 15, 1969 T. KLEIN 3,456,169

INTEGRATED CIRCUITS USING HEAVILY DOPED SURFACE REGION TO PREVENT CHANNELS AND METHODS FOR MAKING

Filed June 20, 1966 2 Sheets-Sheet 1

INVENTOR.
THOMAS KLEIN
BY
Frank R. Jeffries
AGENT

INVENTOR.
THOMAS KLEIN
BY
Frank R. Trifari
AGENT

United States Patent Office 3,456,169

Patented July 15, 1969

3,456,169

INTEGRATED CIRCUITS USING HEAVILY DOPED SURFACE REGION TO PREVENT CHANNELS AND METHODS FOR MAKING

Thomas Klein, Palo Alto, Calif., assignor, by mesne assignments, to U.S. Philips Corporation, New York, N.Y., a corporation of Delaware Filed June 20, 1966, Ser. No. 558,778
Claims priority, application Great Britain, June 22, 1965, 26,340/65
Int. Cl. H01l *11/14, 15/00;* H01g *13/00*
U.S. Cl. 317—235 17 Claims

ABSTRACT OF THE DISCLOSURE

The invention describes an integrated circuit combining semiconductor circuit elements having active regions of the same or opposite type conductivity separated by a semiconductive region over which extends an interconnection on an insulating layer, wherein a highly doped surface region is provided underneath the interconnection to reduce unwanted field-induced leakage currents. In a preferred embodiment, the circuit elements are complementary IGFET's. In another embodiment, one of the IGFET's is built into an island surrounded by a thin heavily doped liner.

Figure 1:
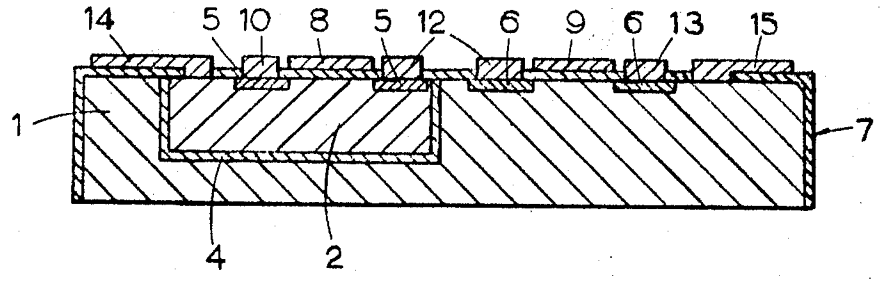

The invention relates to insulated gate field-effect transistors and to methods of manufacturing such transistors.

Circuits are known comprising p-n-p and n-p-n insulated gate field effect transistors, and one object of the present invention is to provide a method of manufacturing a device comprising p-n-p and n-p-n transistors in which the p- and n-regions are included in a single-crystal body.

According to a first aspect of the invention, in a method of manufacturing an insulated gate field-effect transistor device, a cavity is provided extending into, but not through, an initial semiconductor body of one conductivity type, at least the final step in forming the cavity being an etching step. Semiconductor material of the other conductivity type is deposited epitaxially so as to fill the cavity. Excess deposited material is removed so that a single crystal body is provided having a part of the one conductivity type and, at the site of the cavity, a part of the other conductivity type. Two regions of the other conductivity type are provided in the part of the one conductivity type to form source and drain regions and two regions of the one conductivity type are provided in the part of the other conductivity type to form source and drain regions, and a patterned conductive layer is provided on an insulating layer provided on the single crystal body to form gate electrodes and connections to the said diffused regions and the gate electrodes.

According to a second aspect of the invention in a method of manufacturing an insulated gate field-effect transistor device, two cavities are provided extending into, but not through, an initial semiconductor body of one conductivity type, at least the final step in forming the cavities being an etching step. Semi-conductor material of the other conductivity type is deposited epitaxially so as to fill one of the cavities and to fill only partly the other cavity, and semiconductor material of the one conductivity type is deposited epitaxially so as to complete the filling of the other cavity. Excess deposited material is removed so that a single crystal body is provided having a part of the one type conductivity and, at the site of the one cavity, a part of the other conductivity type and, at the site of the other cavity, a part of the other conductivity type which surrounds a part of the one conductivity type. The regions of the one conductivity type are provided in the epitaxially deposited material at the site of the one cavity to form source and drain regions and two regions of the other conductivity type are provided in the epitaxially deposited material of the one conductivity type at the site of the other cavity to form source and drain regions, and a patterned conductive layer is provided on an insulating layer provided on the single crystal body to form gate electrodes and connections to the said diffused regions and the gate electrodes.

It is noted that my prior copending application Ser. No. 454,894, filed May 11, 1965 (now abandoned but replaced by a continuation application, Ser. No. 711,810, filed Mar. 8, 1968), describes and claims a contour deposition method of manufacturing semiconductor devices in which semiconductor material is epitaxially deposited in an aperture, the contents of which are hereby incorporated by reference.

The method according to the invention facilitates the manufacture and connection of large numbers of circuits comprising pairs of p-n-p and n-p-n insulated gate field effect transistors and may be useful in providing small memory circuits or systems comprising numbers of such pairs.

A plurality of p-n-p and/or a plurality of n-p-n insulated gate field effect transistors may be provided.

A plurality of cavities may be provided for one type of insulated gate field effect transistor (n-p-n or p-n-p), each cavity accommodating a single transistor.

The removal of material from the body to form a cavity may be dependent only upon the bulk properties of the material of the body.

The body may be of silicon and the insulating layer provided by oxidizing the silicon surface.

The cavity may extend or the cavities may extend into the initial body from a plane surface of the initial body; this facilitates removal of excess deposited material, which may be by mechanical polishing.

The initial semiconductor body may be homogeneous.

If epitaxial deposition is effected into a cavity in a p-type body or region, an n+ layer may be provided as a cavity lining, and if epitaxial deposition is effected into an n-type body or region, a p+ layer may be provided as a cavity lining either by diffusion process or by an initial epitaxial deposition step. These heavily doped, conducting layers will improve the isolation between adjacent transistors.

Other components may be provided in the body and/or on the insulating layer to provide with the conductive interconnection pattern a more complex device.

The patterned conductive layer may be of metal, for example, of aluminum.

Local highly doped regions may be provided in the material of the semiconductor body beneath parts of the patterned interconnecting conductive layer to reduce unwanted parasitic field-effect action.

The invention also relates to insulated gate field effect transistor devices when manufactured according to the first or second aspects of the invention.

Figure 2:
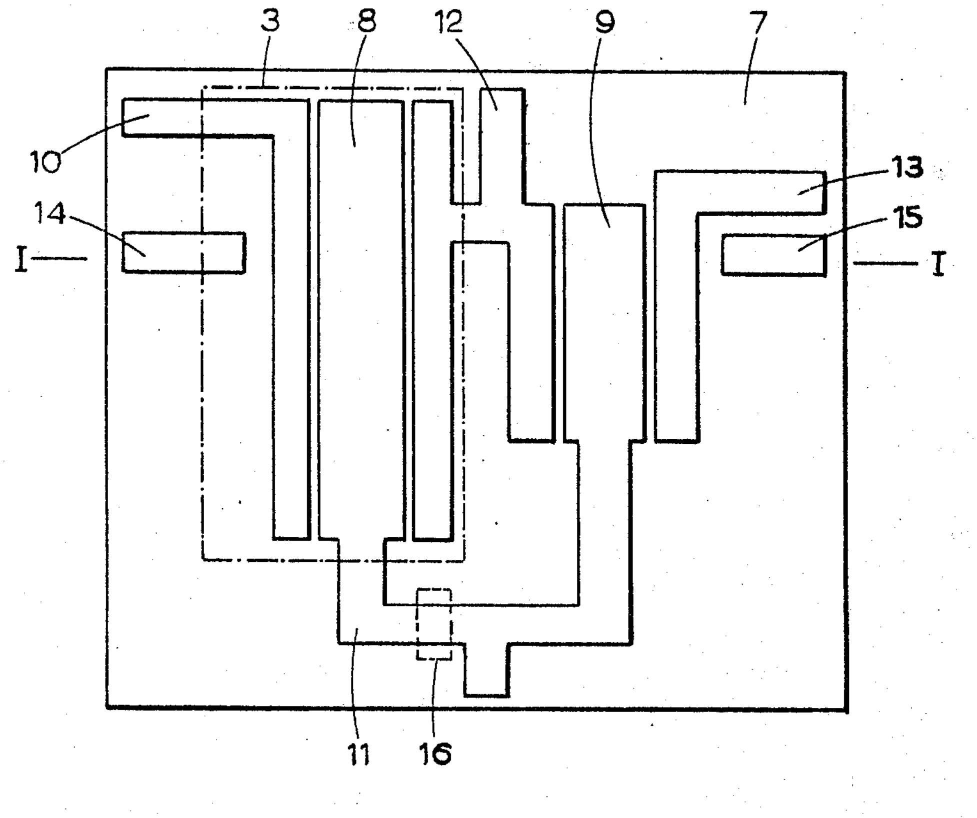
Figure 3:
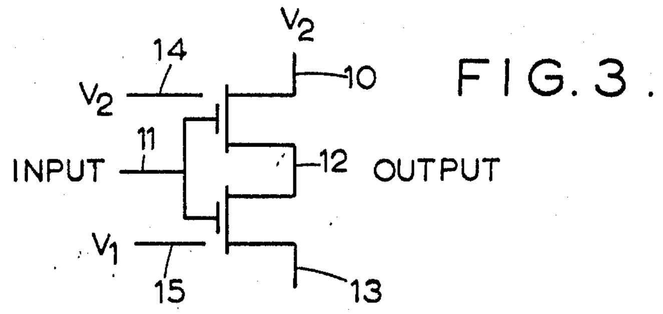
Figure 4:
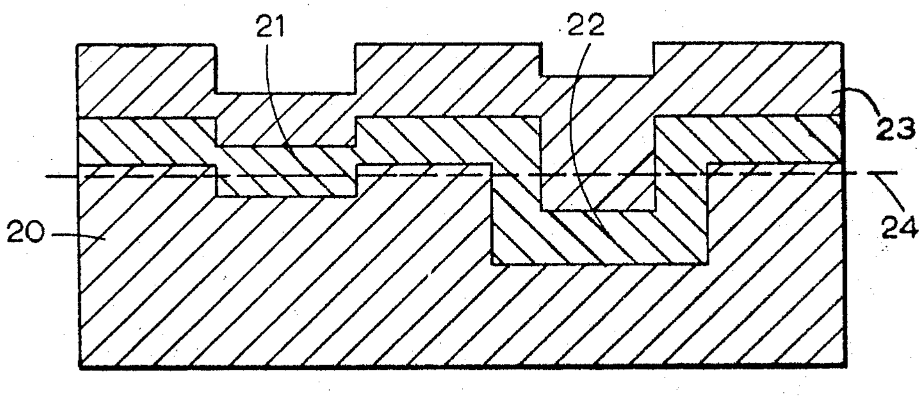

Embodiments of the method and device according to the invention will now be described, by way of example, with reference to the accompanying diagrammatic drawings, in which: FIG. 1 is a cross-sectional view taken along the line I—I of FIG. 2; Fig. 2 is a plan view; and FIG. 3 is a circuit diagram of one embodiment; FIG. 4 is a cross-sectional view, corresponding to that of FIG. 1, of another embodiment at an intermediate stage in the manufacture.

A body of 5 ohm-cm. p-type silicon in the form of a slice 1 which may be 2 cm. in diameter is lapped down, for example, to a thickness of 300$\mu$ and polished, for example by etching, so that it has a damage-free crystal structure and a flat mirror finish on one of its larger surfaces. Such a body can readily provide 100 pairs of insulated gate field-effect transistors. For the sake of simplicity, the following description will relate to the manufacture of one pair only of transistors.

An oxide layer is grown on the body, for example, by heating the body in wet oxygen, saturated with water vapor at 98° C., for one hour at 1,000° C. A photosensitive resist layer is provided on the oxide layer and is exposed in such manner that an area which may be about $100\mu \times 130\mu$ is shielded from the incident radiation. The unexposed parts of the resist layer are removed in a developer. Suitable resist materials are known and are available commercially. In some cases, the remaining previously exposed resist layer may be hardened by baking. The oxide layer is removed over an area corresponding to the shielded area by etching. A suitable etchant is made by adding 1 part by weight of ammonium fluoride to 4 parts by weight of water and adding thereto 3% by volume of 40% hydrofluoric acid. Using a slow-operating silicon etchant, an etching rate of $6\mu$/min. is convenient, a cavity, $12\mu$ deep, is provided in the body. A suitable etchant is 10 parts by volume of 40% hydrofluoric acid and 90 parts by volume of 70% nitric acid.

An n+ region 4 is then provided in the cavity by diffusing phosphorus into the walls of the cavity. The remainder of the body is protected from the action of the phosphorus by the oxide coating. The phosphorus diffusion is effected from an atmosphere produced by bubbling nitrogen at a rate of 20 cc./min. through phosphorus oxychloride at 15° C. and adding to the resultant gas mixture nitrogen flowing at a rate of 200 cc./min. For diffusion to be effected, the body is maintained at 1055° C. for 30 minutes.

The remainder of the oxide coating is then removed by an etching process.

The depth of the cavity is measured to determine that it is as required. The surface of the body is prepared for epitaxial deposition. Preparation may be effected by depreasing in trichloroethylene, boiling in 70% nitric acid, removing the resultant oxide coating with the aid of hydrogen fluoride vapor and washing in distilled deionized water.

The prepared body is placed in a furnace and provided with an n-type epitaxial layer 2 sufficient substantially to fill the cavity. The outer surface epitaxial layer follows the contour of the surface of the body (see the copending application Ser. No. 454,894). The epitaxial deposition may be effected by heating the body to a temperature of 1250° C. by radio frequency heating in the furnace in an atmosphere of very pure hydrogen. Silicon tetrachloride and a small amount of phosphorus trichloride are introduced into the atmosphere in the furnace so that by reaction with the hydrogen a phosphorus-doped epitaxial silicon layer is produced having a resistivity of 2 ohm-cm.

After the epitaxial deposition, the body is removed from the furnace and polished until the surface becomes flat and the boundary of the p-n junction at the site of the cavity is visible when etched with a suitable etchant. The provision of the n+ layer described above, which is optional, also helps make the p-n junction more readily visible.

After degreasing and boiling in 70% nitric acid, an oxide layer is again grown on the body, and the oxide layer is removed over two small window areas to permit diffusion of boron into the epitaxially deposited n-type material 2. The small windows are parallel rectangles each $20\mu$ wide by $120\mu$ long separated by a distance of $15\mu$. Diffusion of boron is effected by passing a current of nitrogen over a quantity of boron nitride heated to 1050° C. and permitting the resultant atmosphere to flow over the body heated to 1050° C. In ten minutes a satisfactory depth of diffusion of $1\mu$ is achieved.

The oxide coating is then regrown and two small parallel rectangular windows, $40\mu$ long $20\mu$ wide and separated by a distance of $15\mu$, made in the oxide layer to permit diffusion of phosphorus into the original p-type body 1, the phosphorus being diffused by the method described above. A satisfactory depth of $1\mu$ for the resultant n-type diffusion is obtained if the body is heated at a temperature of 1000° C. for 15 minutes.

The remainder of the oxide layer is removed by etching and a new oxide layer is grown by heating the body in an atmosphere of dry oxygen at 1200° C. The layer may be 1000 A. to 2000 A. thick, these thicknesses being obtained by heating for 15 minutes and 1 hour, respectively.

Windows are opened in the oxide layer to permit contact to be made to the diffused n-type and p-type regions, to the p-type body and to the epitaxially deposited n-type material. The deposition and diffusion mentioned above are all effected at one side of the slice.

The oxide layer is also removed from the other side of the slice and gold is evaporated on this other side to a depth of a few hundred A. The body is heated to 950° C. for 1 hour to diffuse gold into the slice and thereafter the excess gold is etched off in aqua regia. This other side is then relapped and a mixture of $P_2O_5$ and $B_2O_3$ suspended in glycerine is applied thereto. The body is then heated to 850° C. for 1 hour in order to assist outdiffusion of unwanted rapidly diffusing metal, for example, of copper. The application and heating of the $P_2O_5$ to some extent affects the remaining oxide layer. If greater device stability is required, further steps may be taken to convert the surface of the oxide layer into a phosphorus-containing glass.

A copending patent application Ser. No. 513,511, filed Dec. 13, 1965, describes the diffusion of gold into oxygen-rich silicon.

After such cleaning, which may be effected by dipping the body into an ammonium fluoride etch for 20 sec., an aluminum layer 3000 A. thick is deposited over the oxide coating and on the semiconductor material at the windows by vacuum evaporation. Satisfactory adhesion is obtained if the body is heated to about 150° C. during the aluminum deposition. A photosensitive material is provided over the aluminum and is exposed and developed to define a desired pattern of connections and two gate electrodes. The unwanted aluminum is removed with the aid of a phosphoric acid etching bath at a temperature above 30° C.

FIGS. 1 and 2 show a completed device comprising a p-type body 1, epitaxially deposited n-type material 2, the extent of which is shown in FIG. 2 by the chain-dot line 3, an n+ diffused layer 4, p-type diffused regions 5, n-type diffused regions 6 and an oxide layer 7. Aluminum gate electrodes 8 and 9 and other aluminum conductors are provided. Conductor 10 provides connection to the source 5 of a p-channel MOS device, conductor 11 connects together the gate electrodes 8 and 9 of the two resulting MOS devices, conductor 12 provides connection to and interconnects the drains 5 and 6, conductor 13 provides connection to the source 6 of an n-channel MOS device, and conductors 14 and 15 provide connection to the regions 2 and 1, respectively.

Although not described above, it may be advantageous to provide regions such as the diffused p+ region 16 shown in broken lines in FIG. 2, in order to provide an interruption in a channel which could provide unwanted parasitic field-effect action. Any such heavily doped region 16 may be provided at any suitable stage when similar diffused transistor regions are being provided.

FIG. 3 is a circuit diagram corresponding to the circuit of the device shown in FIGS. 1 and 2. Such a circuit, which may be used for switching, has been suggested so to connect two separate insulated gate field-effect transistors and may be referred to as a complementary pair insulated gate field-effect transistor switching circuit. The diffusion of gold into the body referred to above provides that the surface properties of the body 1 and the deposited material 2 under the oxide layer are such that with either gate at zero voltage relative to either of the sources, there is substantially no current passing from source to drain for the transistor concerned, and with the potentials shown in FIG. 3, when there is a voltage of $V_2-V_1$ on the gates, the lower transistor (11, 12, 13) provides a low impedance path between its source and drain and when there is a voltage of $V_1-V_2$ on the gates, the upper transistor (10, 11, 12) provides a low impedance path between its source and drain. As an alternative to the diffusion composition of oxygen in the surface layer, the substrates may be biased, that is, may have voltages different from those indicated as $V_1$ and $V_2$ in FIG. 3. For a more complex circuit comprising a plurality of transistors like transistor 10, 11, 12 each associated with a separate cavity, the epitaxially deposited substrates may, in operation, be biased differently.

With the device described above, the resistivities of the body 1, and the deposited material 2 may be chosen without difficulty over wide ranges.

It will be obvious that the two transistors may be connected in circuits other than that described above, that other components such as transistors, diodes, resistors and capacitances may be provided in the body 1 and/or on the oxide layer 7 and that in particular other p-n-p and/or n-p-n insulated gate field effect transistors may be provided. If more p-n-p insulated gate field effect transistors are provided, each may be provided in a separate region of n-type material associated with a separate cavity, in order to reduce parasitic effects.

Although the description given above concerns the epitaxial deposition of n-type material on a p-type body, as an alternative, p-type material may be deposited on an n-type body. The n-type regions 6 may alternatively be provided by epitaxial deposition in two small additional cavities previously provided therefor and at the same time as the epitaxially deposited n-type region 2.

Further, the dimensions given above are given as an example. If, for instance, high-gain transistors are required, the dimensions will be altered.

FIG. 4 shows an intermediate stage in an alternative manufacture in which two insulated gate field effect transistors are each associated with a separate aperture. After the apertures are made, in this case one aperture is deeper than the other, in a semiconductor body of p-type conductivity, sufficient n-type material is deposited epitaxially so as to fill the shallower cavity and to fill only partly the deeper cavity. Thereafter, p-type material is deposited epitaxially so as to complete the filling of the deeper cavity. Epitaxial deposition of p-type material may be effected in a manner similar to that described above for n-type material except that a vapor pressure of decaborane ($B_{10}H_{14}$) is provided at the site of the cavity by substitution of decaborane for phosphorus trichloride. FIG. 4 shows the body 20, the n-type epitaxially deposited material 21 and 22 and the p-type epitaxially deposited material 23. In general, it is more economic to complete the epitaxial depositions in the manner shown before removing excess deposited material, for example, to the level shown by the broken line 24. However, the removal may be effected in two stages, one after each deposition, if desired. The provision of diffused p-type and n-type regions in the epitaxially deposited material 21 and 23, respectively, of an insulating layer and of gate electrodes and conductors may then follow in the manner described above with reference to FIGS. 1 and 2. This device can provide a greater degree of freedom from parasitic action than that described with reference to FIGS. 1 and 2.

The general considerations set out above with reference to FIGS. 1, 2 and 3 apply also to the device of FIG. 4.

While I have described my invention in connection with specific embodiments and applications, other modifications thereof will be readily apparent to those skilled in this art without departing from the spirit and scope of the invention as defined in the appended claims.

What is claimed is:

1. An integrated circuit comprising a common semiconductor body having at least two spaced surface regions of the same or opposite conductivity type, plural insulated gate field-effect transistors at least one of which is associated with each of the said spaced surface regions, a thin insulating layer over the surface of the body containing the spaced surface regions and supporting the gate of the field effect transistors, a conductor on the insulating layer and extending at least into the near vicinity of both spaced surface regions, and means in the body underneath at least a portion of the conductor extending between the surface regions for reducing unwanted field-induced leakage currents, said last-named means including a heavily doped region of said body.

2. An integrated circuit as set forth in claim 1 wherein the heavily doped region contains a distribution of active impurities which decreases inward from the surface.

3. A circuit as set forth in claim 1 wherein the insulating layer has a thickness below about 2000 A.

4. A circuit as set forth in claim 3 wherein the field-effect transistors are complementary types.

5. An integrated circuit comprising a common semiconductor body of one conductivity type having within it a first region of the opposite conductivity type, plural insulated gate field-effect transistors at least one of which is in said first region of the opposite conductivity type and at least another of which is in a second region of the body, a thin insulating layer over the surface of the body and supporting the gate of said transistors, a conductor on the insulating layer and extending over both the first and second regions, and a heavily doped third region of said opposite conductivity type surrounding said first region and extending underneath the conductor to isolate the field-effect transistor therein from other circuit elements in the body.

6. An integrated circuit comprising a common semiconductor body having first and second spaced surface regions of one conductivity type separated by a third surface region of the opposite conductivity type, an insulating layer over the surface of the body containing the spaced surface regions, a conductor on the insulating layer and extending at least into the near vicinity of the first and second surface regions and extending over the third surface region, and a highly doped fourth surface region in said third surface region and of the said opposite conductivity type underneath a portion of said conductor for reducing unwanted field-induced leakage currents between the first and second surface regions.

7. An integrated circuit as set forth in claim 6 wherein at least one of the first and second surface regions comprises a zone of a field-effect transistor.

8. A method of manufacturing insulated gate field-effect transistor devices, comprising the steps of forming in a semiconductive body of one conductivity type a cavity extending into but not through the body, epitaxially depositing into the cavity semiconductive material of the opposite conductivity type forming a body of one conductivity type now containing at the site of the former cavity a region of the opposite type conductivity, forming in a region of the body of said one conductivity type spaced zones of the opposite conductivity type constituting source and drain electrodes of a first transistor, forming in the said region of the opposite conductivity type spaced zones of the said one conductivity type constituting source and drain electrodes of a second complementary transistor, providing an insulating layer over a surface of the body, forming a gate electrode over the insulating layer in the vicinity of the source and drain electrodes of the first transistor, forming a gate electrode over the insulating layer in the vicinity of the source and drain electrodes of the second transistor, and providing connections to the source, drain and gate electrodes of both transistors.

9. A method as set forth in claim 8 wherein plural cavities are provided in the body, the first epitaxial deposit fills one of the cavities but only partly another one of the cavities, semiconductive material of the said one conductivity type is epitaxially deposited to complete the filling of the other cavity, and the first transistor is formed in the second epitaxial deposit in the other cavity, and the second transistor is formed in the first epitaxial deposit in the said one cavity.

10. A method as set forth in claim 8 wherein plural cavities are provided each accommodating a single transistor of the same type.

11. A method of manufacturing an insulated gate field effect transistor device, comprising the steps of forming in a semiconductive body of one conductivity type from a surface thereof a cavity extending into but not through the body with an etching treatment terminating the cavity-forming step, epitaxially depositing onto the said surface of the body and including the cavity semiconductive material of the opposite conductivity type, removing excess deposited material from the said surface along a plane to a sufficient depth to expose said original body of one conductivity type now containing at the site of the former cavity a region of the opposite type conductivity, forming in a region of the body of said one conductivity type by diffusion from said plane surface spaced zones of the opposite conductivity type constituting source and drain electrodes of a first transistor, forming in the said region of the opposite conductivity type by diffusion from said plane surface spaced zones of the said one conductivity type constituting source and drain electrodes of a second complementary transistor, providing an insulating layer over the said plane surface of the body, forming a gate electrode over the insulating layer in the vicinity of the source and drain electrodes of the first transistor, forming a gate electrode over the insulating layer in the vicinity of the source and drain electrodes of the second transistor, and providing connections to the source, drain and gate electrodes of both transistors.

12. A method as set forth in claim 11 wherein the excess deposit is removed by mechanical polishing.

13. A method as set forth in claim 11 wherein the body is initially homogeneous.

14. A method as set forth in claim 11 wherein a local, highly doped zone is provided in the body beneath an electrode connection to reduce unwanted parasitic field-effect action.

15. A method as set forth in claim 11 wherein the gate electrodes of both transistors are interconnected, and the drain electrodes of both transistors are interconnected.

16. A method as set forth in claim 11 wherein the body is of one type conductivity and a highly doped layer of the opposite conductivity type is provided as a cavity liner.

17. A method as set forth in claim 16 wherein the cavity liner is formed by diffusion.

References Cited

UNITED STATES PATENTS

| | | | |
|---|---|---|---|
| 3,243,323 | 3/1966 | Corrigan et al. | 148—175 |
| 3,340,598 | 9/1967 | Hatcher | 29—571 |
| 3,341,755 | 9/1967 | Husher et al. | 317—235 |
| 3,356,858 | 12/1967 | Wanlass | 307—88.5 |

JOHN W. HUCKERT, Primary Examiner

R. SANDLER, Assistant Examiner

U.S. Cl. X.R.

29—571